United States Patent
Yanai et al.

(10) Patent No.: US 7,607,924 B2
(45) Date of Patent: Oct. 27, 2009

(54) ELECTRONIC CONTROL UNIT AND METHOD OF MANUFACTURING THE SAME

(75) Inventors: Koji Yanai, Kariya (JP); Takayuki Shibata, Nagoya (JP); Shoichi Ishikawa, Ogaki (JP)

(73) Assignee: Advics Co., Ltd., Kariya, Aichi (JP)

( * ) Notice: Subject to any disclaimer, the term of this patent is extended or adjusted under 35 U.S.C. 154(b) by 84 days.

(21) Appl. No.: 12/022,780

(22) Filed: Jan. 30, 2008

(65) Prior Publication Data

US 2008/0286988 A1  Nov. 20, 2008

(30) Foreign Application Priority Data

Feb. 23, 2007 (JP) ............... 2007-044082
Nov. 29, 2007 (JP) ............... 2007-308972

(51) Int. Cl.
*H01R 12/00* (2006.01)
(52) U.S. Cl. ............... 439/76.2; 439/212; 439/949
(58) Field of Classification Search ............... 439/76.2, 439/212, 949
See application file for complete search history.

(56) References Cited

U.S. PATENT DOCUMENTS

| | | | | |
|---|---|---|---|---|
| 5,759,053 A | * | 6/1998 | Sugiyama | 439/949 |
| 6,264,510 B1 | * | 7/2001 | Onizuka et al. | 439/949 |
| 6,409,522 B1 | * | 6/2002 | Onizuka | 439/949 |
| 2006/0017321 A1 | | 1/2006 | Tsunooka | |

FOREIGN PATENT DOCUMENTS

JP  2006-027528 A  2/2006

* cited by examiner

*Primary Examiner*—Tho D Ta
(74) *Attorney, Agent, or Firm*—Buchanan Ingersoll & Rooney PC

(57) ABSTRACT

An electronic control unit includes a circuit board, a case, and a group of a plurality of bus bars fixed to the case by insert molding. The bus bars each include a terminal portion having a constant-width portion, and a base portion which is wider than the constant-width portion. The base portions of the respective bus bars are arranged parallel to each other in the width direction thereof. Each bus bar is bent at a bent portion of its base portion. The terminal portion of each bus bar extends through the circuit board and is soldered to and electrically connected to a terminal connecting portion of an electrical circuit on the circuit board at a soldered portion. The bent portions of alternate bus bars are offset from the bent portions of the other bus bars in the longitudinal direction of the bus bars, whereby the soldered portions of the respective terminal portions are arranged in a staggered manner.

14 Claims, 8 Drawing Sheets

US 7,607,924 B2

ELECTRONIC CONTROL UNIT AND METHOD OF MANUFACTURING THE SAME

CROSS REFERENCE TO RELATED APPLICATIONS

This application is based on and claims priority under 35 U.S.C. sctn. 119 with respect to Japanese Patent Applications No. 2007-44082 filed on Feb. 23, 2007, and No. 2007-308972 filed on Nov. 29, 2007, the entire content of which is incorporated herein by reference.

BACKGROUND OF THE INVENTION

This invention relates to an electronic control unit for use e.g. in a vehicle brake hydraulic pressure control system, and a method for manufacturing the same.

Typically, vehicle brake hydraulic pressure control systems having electronic control functions comprise a hydraulic unit including a pump, a motor for driving the pump, and solenoid valves for controlling hydraulic pressure, and an electronic control unit. The electronic control unit includes a circuit board carrying control circuits and mounted in and held in position by a case. A typical such brake hydraulic pressure control system is disclosed in JP patent publication 2006-27528A.

The circuit board of such an electronic control unit carries various functional elements (electronic parts) forming control circuits. A large number of bus bars are also connected to the circuit board to electrically connect its electrical circuits to the motor, solenoid valves for controlling hydraulic pressure and other parts of the hydraulic unit. The bus bars are fixed to the case, which is made of resin, by insert molding. In the conventional arrangement, as disclosed in the above patent publication 2006-27528A, with terminal portions of the bus bars arranged in a row, the terminal portions are passed through the circuit board and soldered to terminal connecting portions of the electrical circuits on the circuit board.

In this conventional arrangement, as disclosed in the above patent publication 2006-27528A, because the terminal portions of the bus bars are arranged in a single row and connected to the electrical circuits on the circuit board, the adjacent terminal portions have to be arranged with a sufficiently large pitch in order to prevent short-circuiting therebetween. Thus, a large soldering space is necessary to connect the bus bars, which correspondingly reduces the space on the circuit board for mounting functional elements.

The smaller the soldering space for the bus bars, the larger the mounting space on the circuit board for functional elements. This makes it possible to mount a larger number of functional elements, thereby performing more sophisticated control, or if no such sophisticated control is necessary, it is possible to reduce the size of the circuit board, and thus the size of the electronic control unit including such a circuit board, as well as the size of the entire device using such an electronic control unit.

SUMMARY OF THE INVENTION

An object of the present invention is therefore to reduce the soldering space on the circuit board for the bus bars by improving the manner in which the bus bars are connected to the circuit board.

In order to achieve this object, the present invention provides an electronic control unit comprising a circuit board carrying electronic parts, a case holding the circuit board, and a group of a plurality of bus bars fixed to the case by insert molding, and including the following characterizing features (a) to (e):

(a) The bus bars each comprise a terminal portion having a distal end and a proximal end and including a portion of a constant width, and a base portion contiguous with the proximal end and having a width larger than the above constant width.

(b) The base portions of the bus bars are arranged parallel to each other in a width direction thereof.

(c) Each of the bus bars is bent at a bent portion of its base portion such that the distal end of its terminal portion is directed toward the circuit board.

(d) The terminal portion of each of the bus bars extends through the circuit board and is soldered to and electrically connected to a terminal connecting portion of an electrical circuit on the circuit board at a soldered portion.

(e) The bent portions of alternate ones of the bus bars are offset from the bent portions of the other bus bars in a longitudinal direction of the bus bars, whereby the soldered portions of the respective terminal portions are arranged in a staggered manner.

Preferable additional features of this electronic control unit are listed below:

(1) The terminal portions of the respective bus bars extend parallel to each other.

(2) The bus bars are bent at the respective bent portions at a right angle.

(3) The distances from the proximal ends of the respective terminal portions to the respective soldered portions are equal to each other.

(4) The terminal portions of the respective bus bars have lengths equal to each other.

(5) The distances from the bent portions of the respective bus bars to the respective soldered portions are equal to each other.

(6) The distances from the bent portions of the respective bus bars to the distal ends of the respective terminal portions are equal to each other.

(7) In a state in which the respective bus bars extend in a straight line, with the base portions of the respective bus bars connected to each other at connecting portions, and with the distal ends of alternate ones of the respective terminal portions offset from the distal ends of the other terminal portions in the longitudinal direction of the bus bars, the respective bus bars are bent at their portions spaced from the distal ends of the respective terminal portions by a predetermined distance, and fixed to the case by the insert molding, and then the connecting portions of the respective base portions are cut off.

(8) The terminal portions of any adjacent ones of the bus bars have lengths that differ from each other by a predetermined amount, the distances from the bent portions of the respective bus bars to the distal ends of the respective terminal portions are equal to each other, with the bus bars extending in a straight line, the distal ends of any adjacent ones of the bus bars, as well as the bent portions of any adjacent ones of the bus bars, are offset from each other by a distance that is equal to the above predetermined amount in the longitudinal direction of the bus bars, and the terminal portion of each of the bus bars has a shoulder including the proximal end, the shoulders being aligned with each other in a direction transverse to the longitudinal direction of the bus bars.

(9) The terminal portions of the respective bus bars are equal in length, the terminal portion of each of the bus bars has a shoulder including the proximal end, and with the bus bars extending in a straight line, the bent portions of any adjacent ones of the bus bars are offset from each other in the longitudinal direction of the bus bars, and the shoulders, as well as the distal ends, of the terminal portions of the respective bus bars are aligned with each other in a direction transverse to the longitudinal direction of the bus bars.

(10) The terminal portion of each of the bus bars has a shoulder including the proximal end, and with the bus bars extending in a straight line, the shoulders of the terminal portions of any adjacent ones of the bus bars are offset from each other in the longitudinal direction of the bus bars.

Any of the above-described electronic control units except the one including the feature (9) can be manufactured by a method comprising, with the bus bars extending in a straight line, arranging the bus bars such that the distal ends of alternate ones of the terminal portions are offset from the distal ends of the other terminal portions in the longitudinal direction of the bus bars, and bending the bus bars at portions thereof that are spaced by an equal distance from the distal ends of the respective terminal portions.

Any of the electronic control unit including all of the characterizing features (a) to (e) and one of the additional features (1), (2) and (9) can be manufactured by a method comprising, with the bus bars extending in a straight line, arranging the bus bars such that the distal ends of the respective terminal portions are aligned with each other in a direction transverse to the longitudinal direction of the bus bars, and bending any adjacent ones of the bus bars at portions thereof that are spaced from the distal ends of the respective terminal portions by different distances from each other.

Further, any of the above-described electronic control unit can be manufactured by a method comprising, with the bus bars extending in a straight line, connecting the base portions of the respective bus bars together through a bridge, bending the base portions at predetermined portions thereof in the longitudinal direction of the bus bars, fixing the bus bars to the case by the insert molding, and cutting the bridge, thereby separating the base portions from each other.

The group of bus bars herein used refer to bus bars arranged close to each other in a group and having a flat rectangular cross-section with their longitudinal direction extending perpendicular to their width direction.

Because the soldered portions where the respective bus bars are soldered to the circuit board are arranged in a staggered manner, compared to conventional such electronic control units, it is possible to reduce the pitch between the adjacent terminal portions, thereby concentrating the soldered portions, and thus to reduce the soldering space.

By reducing the pitch between the adjacent terminal portions, the ratio of the length of the soldering space to its width can be reduced, so that it is possible to reduce the soldering tank for soldering bus bars. Thus, it is possible to reduce the size of the manufacturing facilities too.

By arranging the terminal portions of the group of bus bars parallel to each other, it is possible to reduce the pitches between the adjacent terminal portions, thereby further concentrating the soldered portions, compared to an arrangement in which the terminal portions are not arranged parallel to each other.

By bending the respective bus bars at a right angle at the respective bent portions, the terminal portions can be more easily inserted through the circuit board with the terminal portions directed in the same direction.

In the arrangement in which the distances from the respective bent portions to the corresponding soldered portions are equal to each other, stresses applied to the soldered portions of the terminal portions due to a difference in the thermal expansion between the bus bars and the circuit board become substantially uniform. This avoids stress concentration on a specific soldered portion or portions, thus improving the quality and reliability of the soldered portions.

In the arrangement in which, with the bus bars extending in a straight line, the shoulders of the terminal portions of any adjacent ones of the bus bars are offset from each other in the longitudinal direction of the bus bars, because the shoulders, on which stress tends to concentrate when stamping the bus bars from the blank, are spaced a longer distance from each other, the bus bars, as well as the stamping die, are less likely to be damaged.

In the arrangement in which the shoulders of the respective terminal portions are aligned with each other in a direction transverse to the longitudinal direction of the bus bars, the bus bars of can be stamped from the blank sheet by an ordinary known method, i.e. progressive die stamping.

With the bus bars extending in a straight line, by arranging the bus bars such that the distal ends of alternate ones of the terminal portions are offset from the distal ends of the other terminal portions in the longitudinal direction of the bus bars, and bending each bus bar at its portion that is spaced by a predetermined distance from the distal end of its terminal portion, the soldered portions of the group of bus bars can be arranged in a staggered manner as described above. Thus, it is possible to reduce the pitch between the adjacent terminal portions, and thus the soldering space. This in turn makes it possible to reduce the size of the soldering tank for soldering bus bars.

In the arrangement in which the distances from the bent portions of the respective bus bars to the distal ends of the respective terminal portions are equal to each other, because the distal ends of the terminal portions of the respective bus bars are disposed on a single plane, it is possible to minimize and equalize the lengths of the portions of the respective terminal portions protruding from the circuit board which are necessary for soldering. This in turn makes it possible to minimize the mounting space and thus to further reduce the size of the electronic control unit.

In the arrangement in which with the bus bars extending in a straight line, the distal ends of the terminal portions of the respective bus bars are transversely aligned with each other, and any adjacent bus bars are bent at portions thereof that are spaced from the distal ends of said respective terminal portions by different distances from each other, it is possible to first insert the terminal portions of which the distal ends are located higher into the respective holes in the circuit board, and then insert the other terminal portions, of which the distal ends are located lower, into the respective holes in the circuit board. With this arrangement, the distal ends of the terminal portions of the respective bus bars can be easily inserted into the respective holes in the circuit board.

BRIEF DESCRIPTION OF THE DRAWINGS

Other features and objects of the present invention will become apparent from the following description made with reference to the accompanying drawings, in which.

DETAILED DESCRIPTION OF THE PREFERRED EMBODIMENTS

Figure 1:
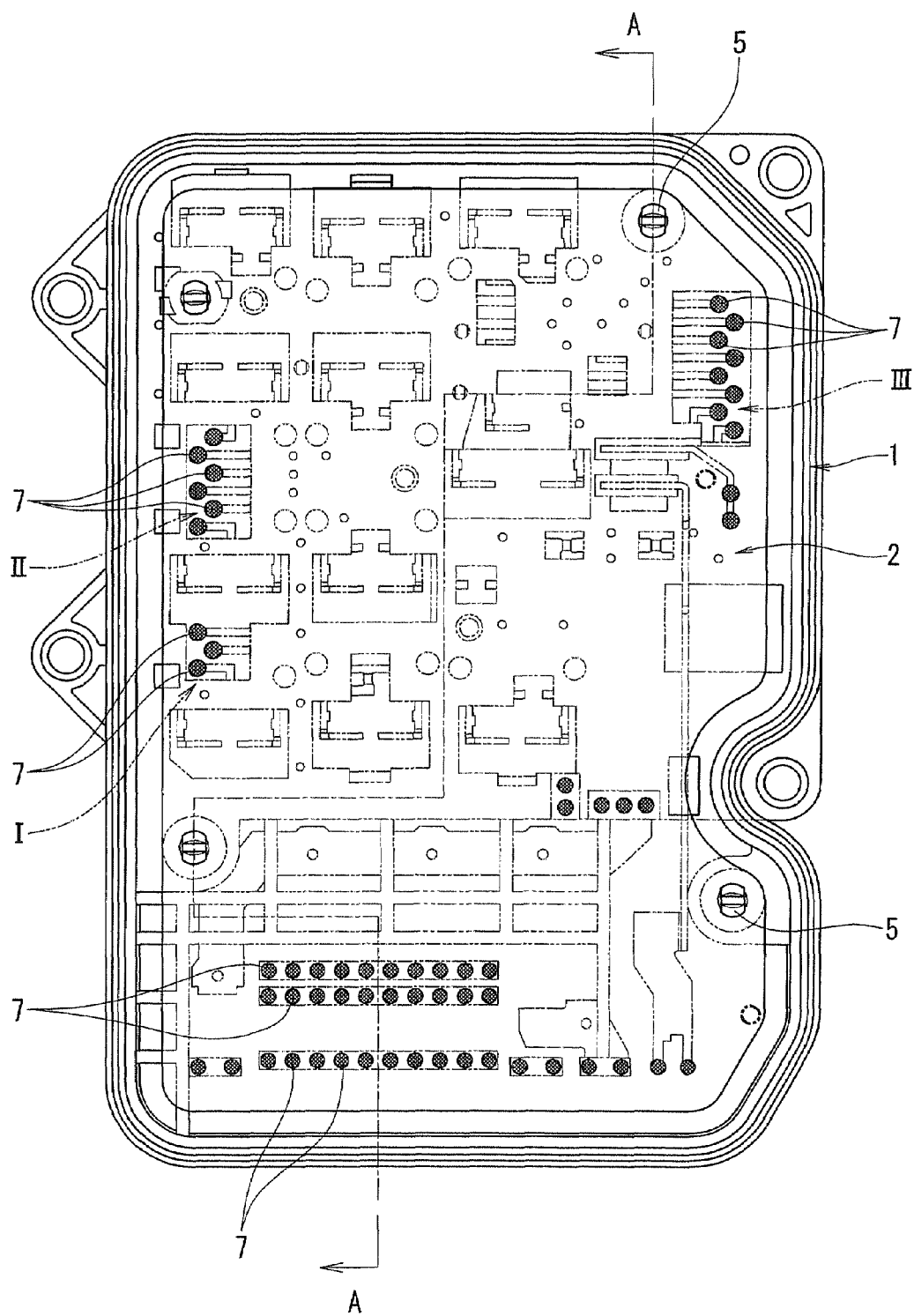
FIG. 1 is a plan view of an electronic control unit embodying the invention, with its case removed.
Figure 2:
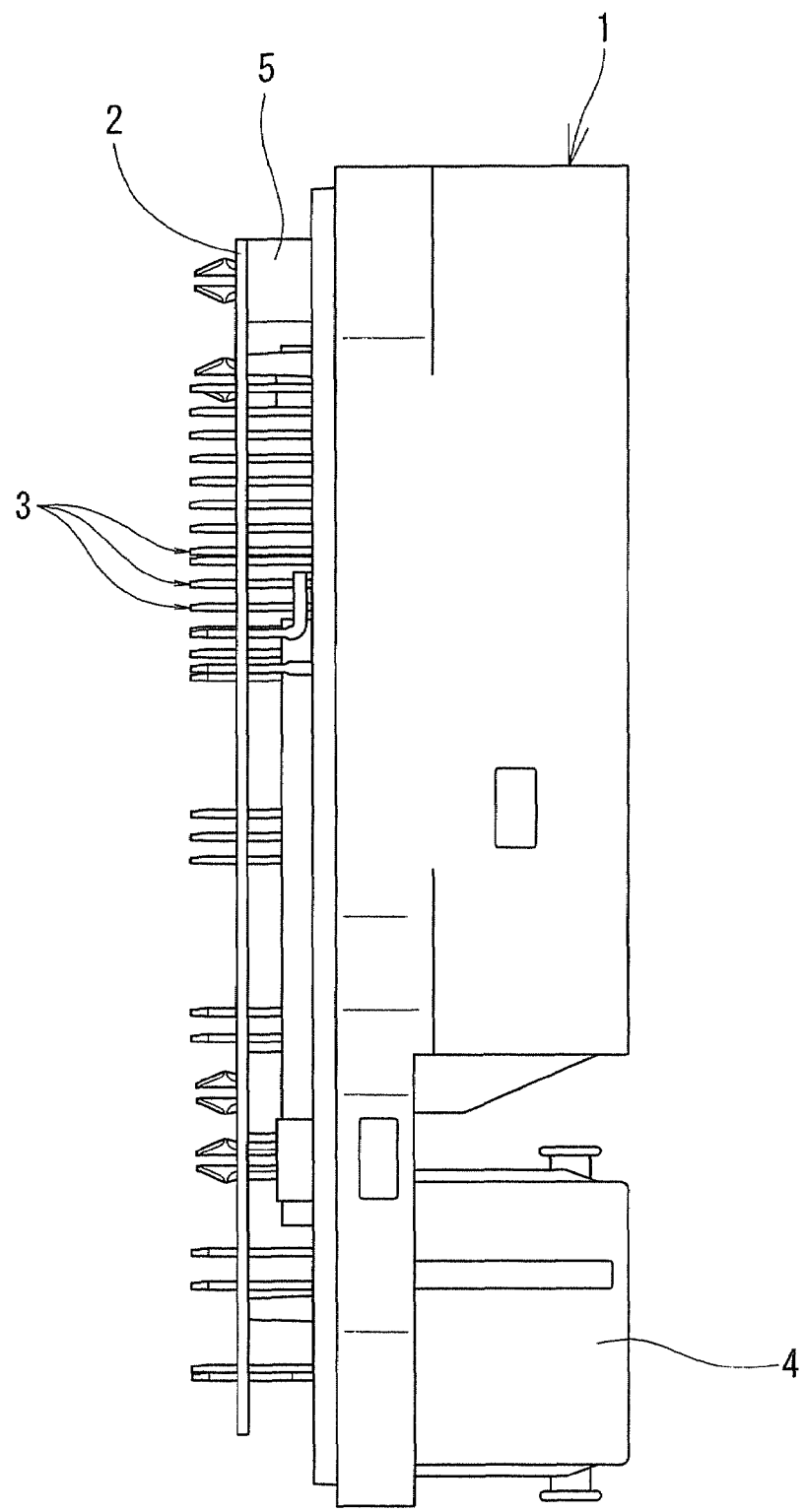
FIG. 2 is a side view of the electronic control unit of FIG. 1.
Figure 3:
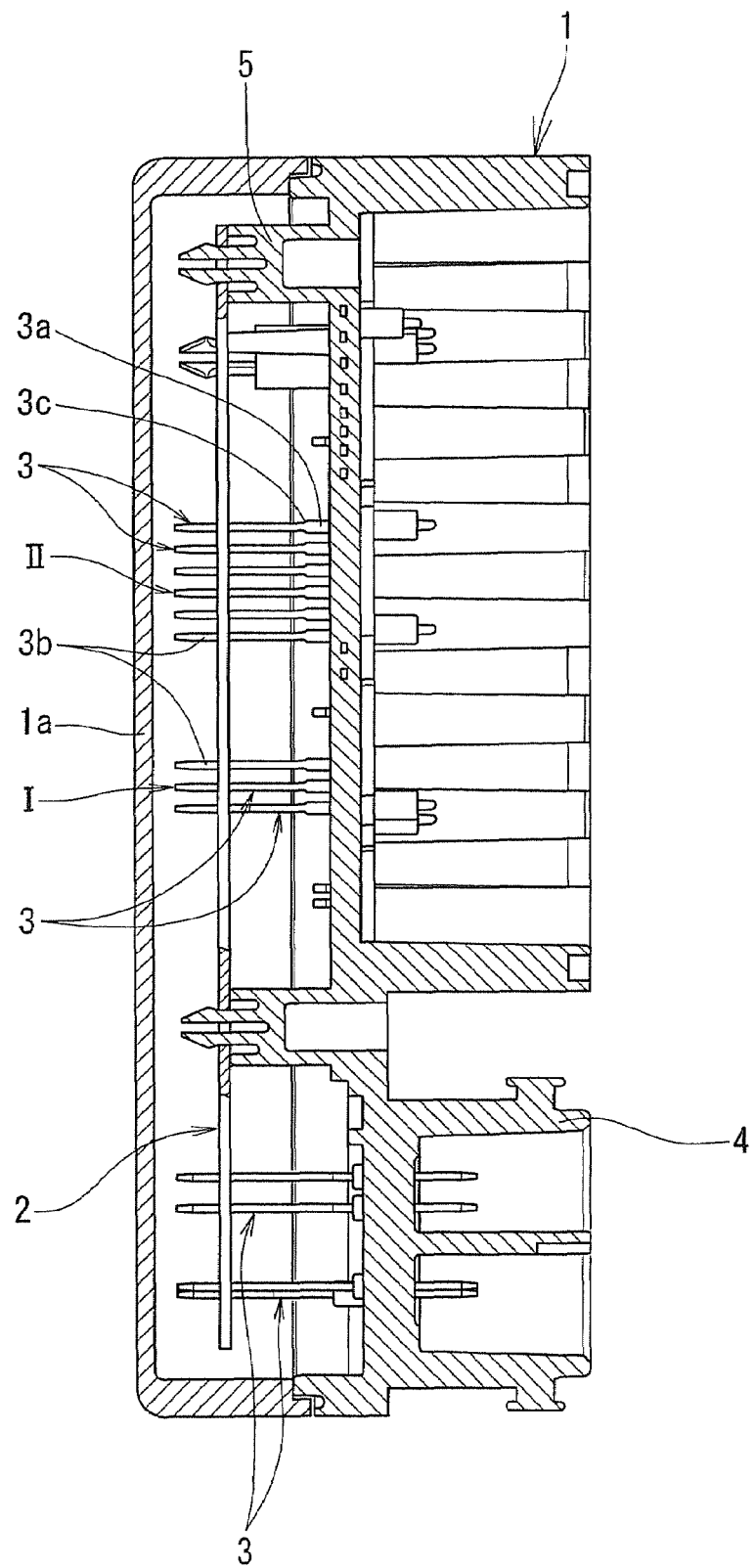
FIG. 3 is a sectional view taken along line A-A of FIG. 1.

Now referring to FIGS. 1 to 10, the electronic control unit embodying the present invention is described. This electronic control unit constitutes a brake hydraulic pressure control system in cooperation with the hydraulic unit disclosed in the above-described JP patent publication 2006-27528A. As shown in FIGS. 1 and 2, the electronic control unit comprises a case 1 which covers one side of a housing of a hydraulic unit (not shown), a circuit board 2 mounted in and supported by the case 1, and bus bars 3 embedded in the case 1 by insert molding.

Figure 4:
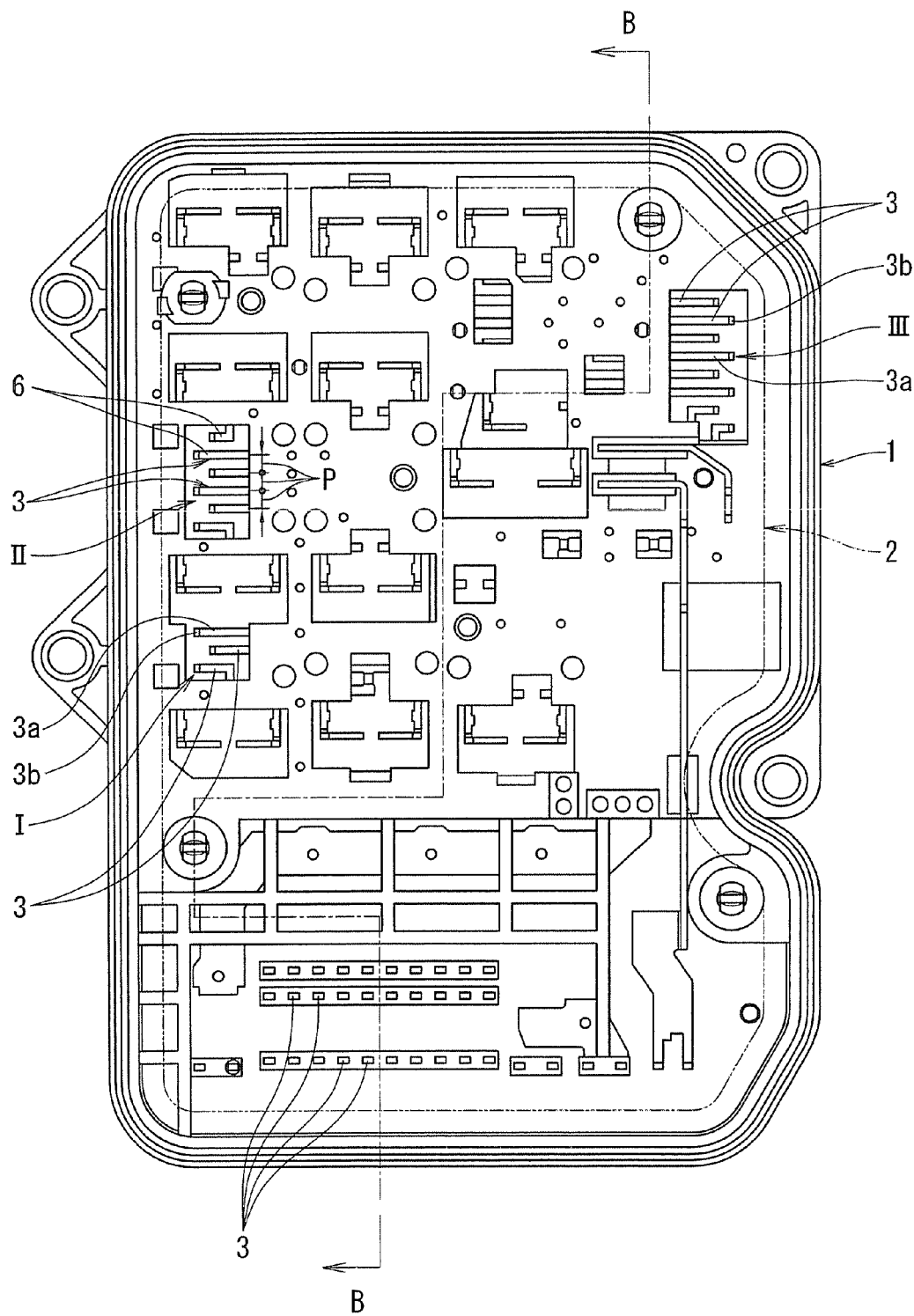
FIG. 4 is a plan view of the electronic control unit of FIG. 1, with the cover of the case and the circuit board removed.
Figure 5:
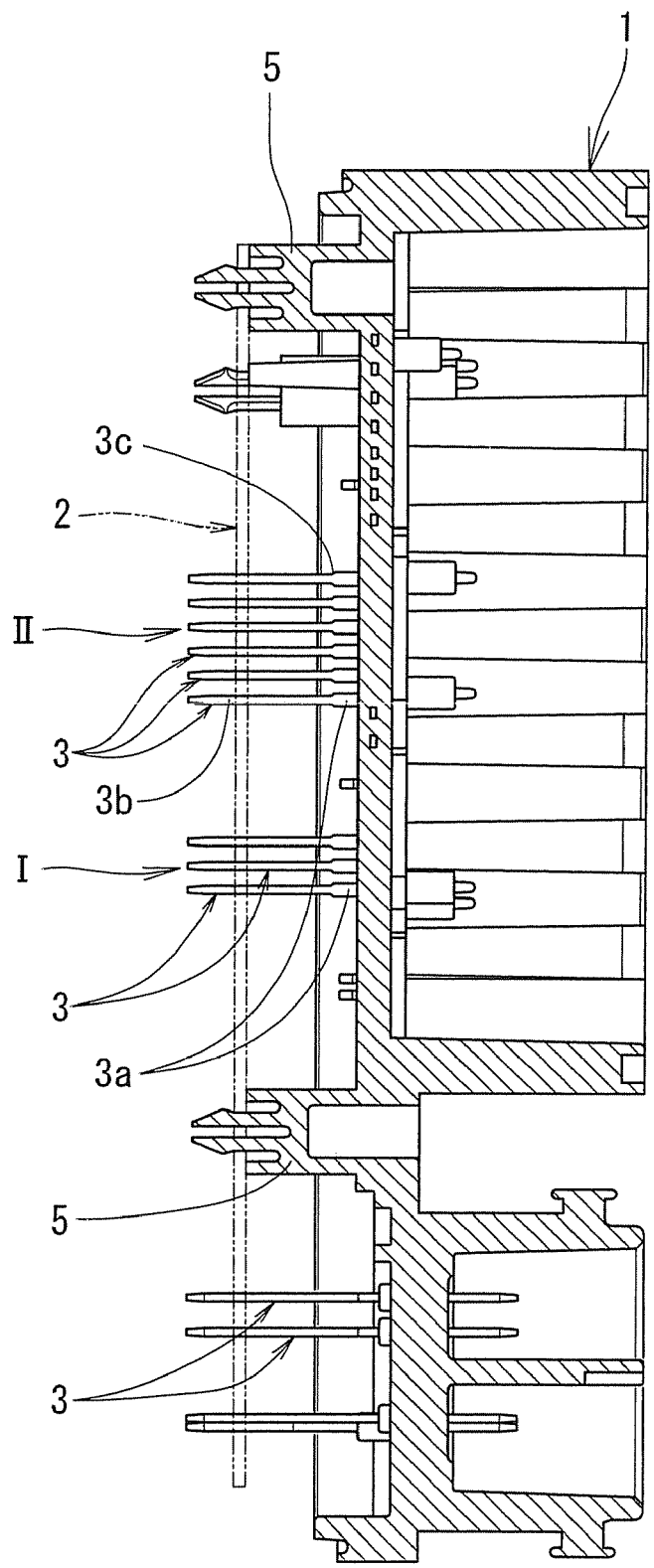
FIG. 5 is a sectional view taken along line B-B of FIG. 4.

The case 1 includes a cover 1a (see FIG. 3) that covers the circuit board 2. FIGS. 1 and 2 show the state in which the cover 1a is not yet mounted. FIGS. 4 and 5 show the state in which the circuit board 2 is not yet mounted.

The case 1 has a connector inserting portion 4 into which an external connector (not shown) is inserted through which the electronic control unit is electrically connected to a power source, the motor of the hydraulic unit, etc.

The circuit board 2 is mounted to supports 5 provided on the case 1 by inserting the supports 5 into mounting holes formed in the circuit board. The supports 5 are configured to prevent separation of the circuit board 2 once the circuit board is mounted to the supports.

Functional elements (including electronic parts, not shown) that constitute the control circuit are mounted on the circuit board 2, and necessary electrical circuits (not shown) are formed thereon.

The bus bars 3 are provided in a plurality of groups including groups I to III shown in FIGS. 1 and 4. The bus bars in groups I to III include features that characterize the present invention.

Figure 6:
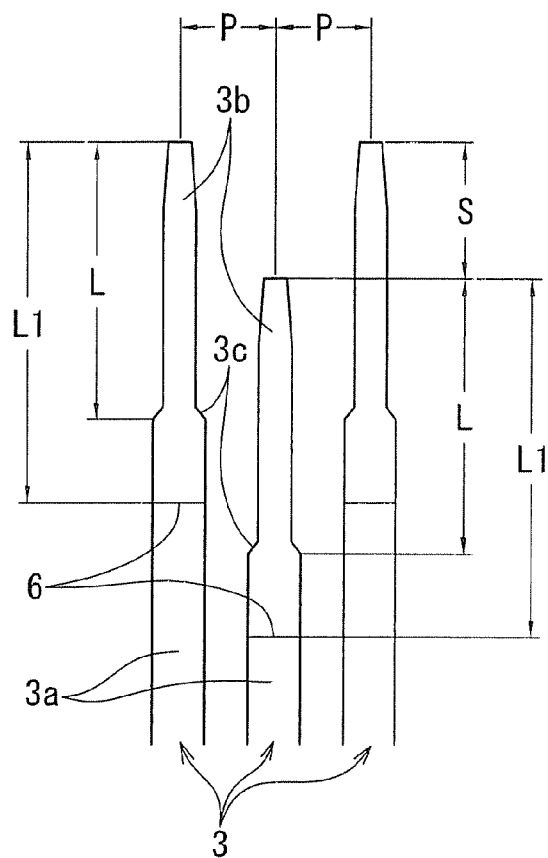
FIG. 6 is a plan view of bus bars each having a terminal portion.
Figure 7:
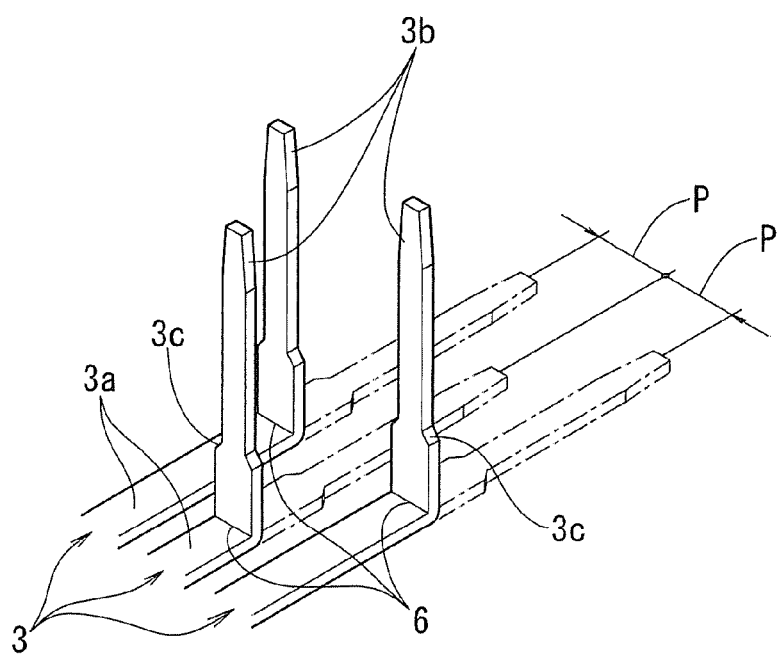
FIG. 7 is a perspective view of the bus bars of FIG. 6 after being bent.
Figure 8:
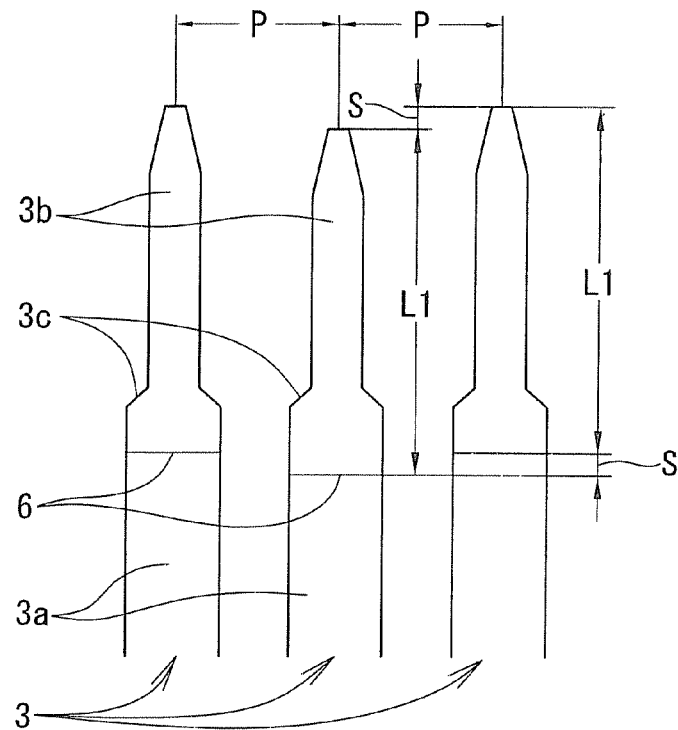
FIG. 8 is a plan view of bus bars with different terminal portions.

Although the bus bar groups I to III comprise different numbers of bus bars, they are basically of the same structure. Thus, description is now made only of the bus bar group I. As shown in FIGS. 6 to 8, the bus bar group I comprise a plurality of (three in FIGS. 6 to 8) bus bars 3.

Each bus bar 3 of the bus bar group I comprises a base portion 3c and a terminal portion 3b. As shown in FIGS. 6 to 9, the base portions 3a of the bus bars 3 are arranged in parallel to each other with pitches P that are equal to each other (but may not be equal to each other). The terminal portion 3b has a distal end and a proximal end connected to the base portion 3a, and comprises a portion including the distal end and having a constant width which is narrower than the width of the base portion, and a shoulder 3b' including the proximal end.

The bus bars 3 shown in FIGS. 6 to 9 are stamped from a blank sheet with a die (not shown). The bus bars of FIG. 6 are formed such that with the respective bus bars extending in a straight line as shown, the distal end of the central bus bar 3 is longitudinally offset from the distal ends of the bus bars 3 on both sides by a distance S, and the terminal portions 3b of the respective bus bars 3 have an equal length L. Thus, in this state, the shoulders 3b' of the adjacent bus bars 3 are also longitudinally offset from each other by the distance S. Such bus bars are formed simultaneously by stamping. Otherwise, alternate bus bar 3, of which the shoulder 3b' are transversely aligned with each other, are formed by first progressive die stamping in which the blank sheet is fed in the width direction of the bus bars, and then the other bus bars are formed by second progressive die stamping.

The base portion 3a of each of the bus bars 3 thus formed is bent at its portion 6 located near the terminal portion, preferably at a right angle. The bent portion 6 of the central bus bar 3 is longitudinally offset from the bent portions of the bus bars 3 on both sides by the distance S, i.e. the same distance as the distance by which the distal end of the terminal portion 3b thereof is offset from the distal ends of the terminal portions of the bus bars on both sides. Thus, the distances L1 between the bent portions 6 and the distal ends of the terminal portions 3 of the respective bus bars 3 are equal to each other.

With the bus bars 3 bent as shown in FIG. 7, the bus bars 3 are fixed to the case 1 by insert molding. The circuit board 2 is then mounted to the case 2 such that the terminal portions 3b of the respective bus bars 3 are inserted at their distal end portions through holes formed in the circuit board 2. In this state, the portions 7 of the terminal portions 3a that are located in or near the respective holes of the circuit board 2 are soldered to the electrical circuit on the circuit board 2 to electrically connect the bus bars 3 to the electrical circuits on the circuit board 2. The soldered portions 7 are shown in FIG. 1. Because the bus bars 3 in the bus bar groups I to III have the bent portions 6 of the adjacent bus bars longitudinally offset from each other (see FIGS. 6 and 7), the soldered portions 7 are arranged in a staggered manner as seen from the top of the circuit board, as shown in FIG. 1. With this arrangement, it is possible to reduce the pitch P between the adjacent terminal portions (see FIGS. 4, 6 and 7), and thus the distance between the adjacent soldered portions 7 in the width direction of the bus bars, compared to conventional arrangements.

Because the soldered portions 7 of the respective bus bars 3 are at the same distance L2 from the respective bent portions 6, if the bus bars 3 and the circuit board 2 are thermally deformed, stresses applied to the respective soldered portions 7 due to a difference in thermal expansion coefficient between the bus bars 3 and the circuit board 2 are substantially uniform. This avoids the stress concentration on a specific soldered portion or portions, thereby improving the quality and reliability of the soldered portions. In the embodiment of FIGS. 6 and 7, the distances L3 from the proximal ends of the respective terminal portions 3b to their soldered portions 7 are equal to each other.

Because the bent portions 6 of the adjacent bus bars are longitudinally offset from each other, with each bus bar extending in a straight line as shown in FIG. 6, the shoulders 3b' of the respective bus bars are also longitudinally offset from each other. Thus, when the bus bars are stamped from a blank sheet, the shoulders 3b', on which stress tends to concentrate, are sufficiently spaced apart from each other. This prevents damage to the bus bars as well as to the stamping die.

The terminal portions 3b of the bus bars 3 shown in FIG. 6 are all of the same length. But as shown in FIG. 8, the terminal portion 3b of every other bus bar may have a different length from the terminal portions of the other bus bars. In the arrangement of FIG. 6, as described earlier, because the bent portions 6 are longitudinally offset from each other by the distance S, the shoulders 3b' of the bus bars 3 are also longitudinally offset from each other by the distance S. In the arrangement of FIG. 8, the bent portions 6 are longitudinally offset from each other by the distance S, and the terminal portion 3b of the central bus bar 3 has a length that is shorter by S than the terminal portions of the two bus bars 3 on both sides so that the shoulders 3b' are transversely aligned with each other. Such bus bars can be formed by separately stamping the shoulders 3b' and the terminal portions 3b. Alternatively, such bus bars may be formed by stamping bus bars of the same shape in first progressive die stamping, and then shortening the terminal portions of alternate bus bars in second progressive die stamping. Progressive die stamping is an ordinary stamping method in which a blank sheet is fed intermittently at a constant pitch. By using this method, it is possible to readily improve work efficiency.

Figure 9:
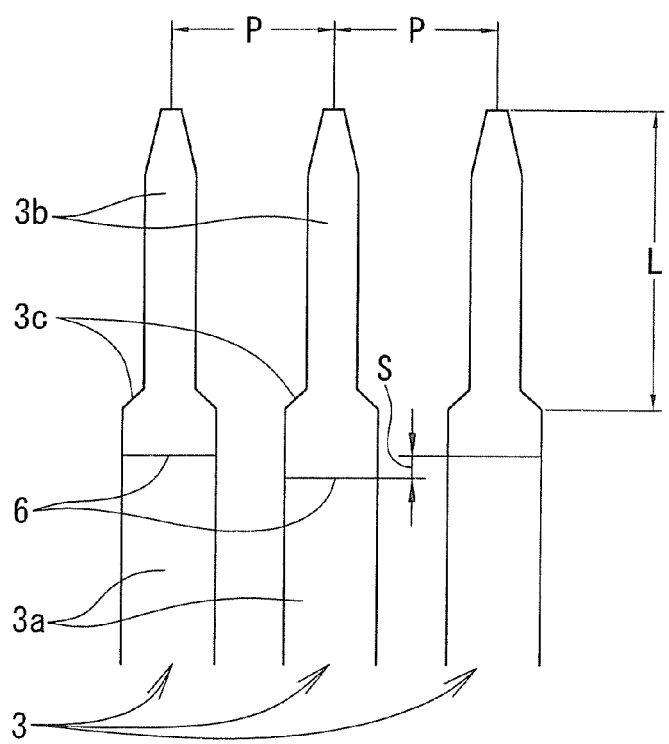
FIG. 9 is a plan view of bus bars with still different terminal portions.

In the arrangement of FIG. 9, the distal ends and the shoulders 3b' of the respective bus bars are transversely aligned with each other, with only their bent portions S offset from each other by the distance S in the longitudinal direction of the bus bars. In this arrangement, unlike the arrangements of FIGS. 6 and 7 and FIG. 8, the portion of the central bus bar 3 from its bent portion 6 to the distal end of the terminal portion 3b is shorter in length by S than the corresponding portions of the bus bars 3 on both sides. But because the terminal portion of the central bus bar protrudes from the circuit board 2 by a length longer by S than the protruding portions of the other terminal portions, the distances between the bent portions of the respective bus bars to the circuit board are the same. One advantage of this arrangement is that the portions of the bus bar including their distal ends can be finished in a single progressive stamping step.

The distance S is determined such that short-circuiting does not occur between the soldered portions of the adjacent bus bars.

Figure 10:
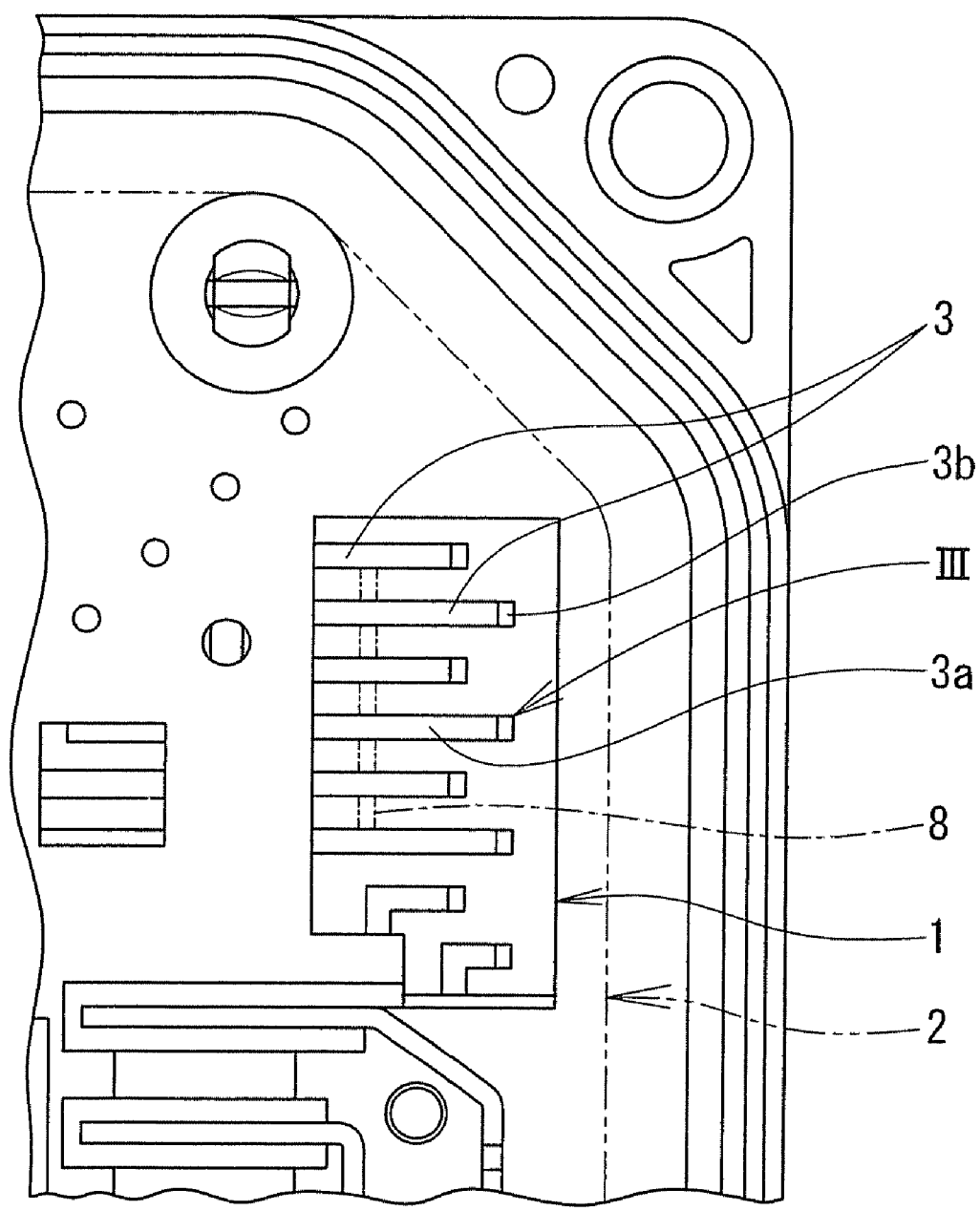
FIG. 10 is an enlarged view of a portion of FIG. 4 where there is the bus bar group III.

The group of bus bars 3 have their base portions 3a connected together through a bridge 8 shown in FIG. 10 such that before being bent, the distal ends of their terminal portions 3b are longitudinally offset from each other. In this state, the bus bars 3 are bent at their portions that are spaced a predetermined distance from the distal ends of their respective terminal portions 3b, and fixed to the case 1 by insert molding. Thereafter, the bridge 8 is cut off. FIG. 4 shows this state, i.e. the state after the bridge 8 has been cut off. The electronic control unit shown is formed in this manner. In the arrangement of FIG. 6, since as shown in FIG. 6, the shoulders 3b' are longitudinally offset from each other before the bus bars are bent, the shoulders, on which stress tends to concentrate when stamping the bus bars, are sufficiently spaced from each other. Thus, it is possible to reduce damage both to the bus bars and to the stamping die. In the arrangements of FIGS. 8 and 9, in which the shoulders 3b' of the respective bus bars are aligned transversely of the bus bars, bus bars can be formed by progressive die stamping.

The electronic control unit according to the present invention can be especially advantageously used in a vehicle brake hydraulic pressure control system. But its use is not limited to such a system. The present invention is applicable to every type of electronic control unit provided on an electronically controlled device and including a case.

What is claimed is:

1. An electronic control unit comprising a circuit board carrying electronic parts, a case holding said circuit board, and a group of a plurality of bus bars fixed to said case by insert molding, wherein said bus bars each comprise a terminal portion having a distal end and a proximal end and including a portion of a constant width, and a base portion contiguous with said proximal end and having a width larger than said constant width, wherein said base portions of said respective bus bars are arranged parallel to each other in a width direction thereof, wherein each of said bus bars is bent at a bent portion of its base portion such that the distal end of its terminal portion is directed toward said circuit board, wherein said terminal portion of each of said bus bars extends through said circuit board and is soldered to and electrically connected to a terminal connecting portion of an electrical circuit on said circuit board at a soldered portion, and wherein said bent portions of alternate ones of said bus bars are offset from the bent portions of the other bus bars in a longitudinal direction of said bus bars, whereby said soldered portions of said respective terminal portions are arranged in a staggered manner.

2. The electronic control unit of claim 1 wherein said terminal portions of said respective bus bars extend parallel to each other.

3. The electronic control unit of claim 2 wherein said bus bars are bent at said respective bent portions at a right angle.

4. The electronic control unit of claim 1 wherein the distances from said proximal ends of said respective terminal portions to said respective soldered portions are equal to each other.

5. The electronic control unit of claim 1 wherein said terminal portions of said respective bus bars have lengths equal to each other.

6. The electronic control unit of claim 1 wherein the distances from said bent portions of said respective bus bars to said respective soldered portions are equal to each other.

7. The electronic control unit of claim 1 wherein the distances from said bent portions of said respective bus bars to said distal ends of said respective terminal portions are equal to each other.

8. The electronic control unit of claim 1 wherein in a state in which said respective bus bars extend in a straight line, with said base portions of said respective bus bars connected to each other at connecting portions, and with said distal ends of alternate ones of said respective terminal portions offset from the distal ends of the other terminal portions in the longitudinal direction of said bus bars, said respective bus bars are bent at their portions spaced from the distal ends of said respective terminal portions by a predetermined distance, and fixed to said case by said insert molding, and then said connecting portions of said respective base portions are cut off.

9. The electronic control unit of claim 1 wherein said terminal portions of any adjacent ones of said bus bars have lengths that differ from each other by a predetermined amount, wherein the distances from said bent portions of the respective bus bars to the distal ends of said respective terminal portions are equal to each other, wherein with said bus bars extending in a straight line, said distal ends of any adjacent ones of said bus bars, as well as said bent portions of any adjacent ones of said bus bars, are offset from each other by a distance that is equal to said predetermined amount in the longitudinal direction of said bus bars, and wherein said terminal portion of each of said bus bars has a shoulder including said proximal end, said shoulders being aligned with each other in a direction transverse to the longitudinal direction of said bus bars.

10. The electronic control unit of claim 1 wherein said terminal portions of said respective bus bars are equal in length, wherein said terminal portion of each of said bus bars has a shoulder including said proximal end, and wherein with said bus bars extending in a straight line, said bent portions of any adjacent ones of said bus bars are offset from each other in the longitudinal direction of said bus bars, and said shoulders, as well as said distal ends, of said terminal portions of said respective bus bars are aligned with each other in a direction transverse to the longitudinal direction of said bus bars.

11. The electronic control unit of claim 1 wherein said terminal portion of each of said bus bars has a shoulder including said proximal end, and wherein with said bus bars extending in a straight line, said shoulders of the terminal portions of any adjacent ones of said bus bars are offset from each other in the longitudinal direction of said bus bars.

12. A method of manufacturing the electronic control unit of claim 1, said method comprising, with said bus bars extending in a straight line, arranging said bus bars such that said distal ends of alternate ones of said terminal portions are offset from the distal ends of the other terminal portions in the longitudinal direction of said bus bars, and bending said bus bars at portions thereof that are spaced by an equal distance from the distal ends of said respective terminal portions.

13. A method of manufacturing the electronic control unit of claim 1, said method comprising, with said bus bars extending in a straight line, arranging said bus bars such that said distal ends of said respective terminal portions are aligned with each other in a direction transverse to the longitudinal direction of said bus bars, and bending any adjacent ones of said bus bars at portions thereof that are spaced from the distal ends of said respective terminal portions by different distances from each other.

14. A method of manufacturing the electronic control unit of claim 1 comprising, with said bus bars extending in a straight line, connecting said base portions of said respective bus bars together through a bridge, bending said base portions at predetermined portions thereof in the longitudinal direction of said bus bars, fixing said bus bars to said case by said insert molding, and cutting said bridge, thereby separating said base portions from each other.

* * * * *